(12) United States Patent
Ali

(10) Patent No.: US 6,501,400 B2
(45) Date of Patent: Dec. 31, 2002

(54) CORRECTION OF OPERATIONAL AMPLIFIER GAIN ERROR IN PIPELINED ANALOG TO DIGITAL CONVERTERS

(75) Inventor: Ahmed Ali, Belle Mead, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/847,612

(22) Filed: May 2, 2001

(65) Prior Publication Data

US 2002/0047790 A1 Apr. 25, 2002

(51) Int. Cl.$^7$ ................................................ H03M 1/06
(52) U.S. Cl. ....................... 341/118; 341/120; 341/143; 341/155; 341/156
(58) Field of Search ................................ 341/118, 120, 341/155, 143, 6

(56) References Cited

U.S. PATENT DOCUMENTS 6,037,891 A * 3/2000 Griph ......................... 341/161

* cited by examiner

Primary Examiner—Michael Tokar
Assistant Examiner—Linh Van Nguyen
(74) Attorney, Agent, or Firm—W. Daniel Swayze, Jr.; W. James Brady; Frederick J. Telecky, Jr.

(57) ABSTRACT

A pipeline analog to digital converter that includes a main pipeline including a plurality of analog to digital converter stages and a shadow pipeline for compensating the output of the main pipeline. Each of the analog to digital converter stages in the main pipeline provides a digital output and an analog residue signal. The shadow pipeline includes one or more stages that receive at least one gain error signal from one of the analog to digital converter stages in the main pipeline. The shadow pipeline is configured and arranged to processes the gain error signal to form a compensation signal. The compensation signal is combined with the analog residue signal to provide a compensated residue signal in which the finite error gain has been substantially removed. Alternatively, the compensation signal may be converted into a digital format and combined with the digital output bits of one or more of the analog to digital converter stages in the main pipeline to provide a compensated digital output that has had substantially all of the gain error removed therefrom.

19 Claims, 6 Drawing Sheets

CORRECTION OF OPERATIONAL AMPLIFIER GAIN ERROR IN PIPELINED ANALOG TO DIGITAL CONVERTERS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

Pipelined analog-to-digital converters (ADCs) are well known in the art. A typical pipelined ADC includes a plurality of ADC stages in which each ADC stage converts a portion of an analog input signal into one or more digital bits. The first ADC stage receives the analog input signal and provides two outputs, the first output includes one or more digital bits and the second output is an analog residue voltage. The one or more digital bits represent the portion of the analog input signal that has been converted into a digital format. The analog residue voltage represents the amount of the analog input signal remaining after the portion converted into the one or more digital bits by the ADC stage has been removed. Each subsequent ADC stage receives the analog residue voltage from the preceding ADC stage and converts a portion of it into one or more digital bits. The ADC stage then removes that portion converted into the digital format from the received input analog residue signal and provides an output analog residue signal to the next adjacent stage. Typically, the first ADC stage in a pipelined ADC provides the most significant bit(s) and the last stage provides the least significant bit(s). The digital bits from each ADC stage taken together represent the digital value of the input signal provided to the ADC.

FIG. 1 illustrates a typical prior art pipeline ADC 100 having a main pipeline 101 that includes a plurality of N stages 102, 104, 106, 108, and 110. The first stage 102 receives an input signal, Vin, on input line 111. Each stage 102–110 provides one or more digital output bits on lines 103–111 respectively. Stage 108 is shown in more detail as an exemplary ADC stage.

Stage 108 includes a M-bit ADC 112 that receives the input signal $V_{in}$ via line 109. The input signal $V_{in}$ may be either the analog input signal or a residue signal from a preceding stage. The M-bit ADC 112 provides M-bits as an output digital signal on line 114. A M-bit digital-to-analog-converter 116 also reads the M-bit digital output and provides an analog voltage on line 117 that corresponds to the M-bit word provided by ADC 112. A subtraction module 119 subtracts the analog voltage on line 118 from the input voltage $V_{in}$ on line 109. The resulting difference is the residue of the input signal remaining after the portion of the input voltage converted by the ADC stage 112 has been removed. An amplifier 120 amplifies the residue voltage, wherein the amplifier has a gain equal to $2^M$, or in some cases $2^{M-1}$. The amplified residue signal is provided to the next adjacent ADC stage in the pipeline via line 122.

In theory the pipelined ADC 100 should provide a nearly perfect digital representation of the input signal. However, in practice the components and amplifiers used in the pipelined ADC are not ideal. For example the operational amplifiers (op-amps) used in the amplifier modules in each ADC stage have a finite open-loop gain. Because of the finite gain, each amplifier module has a gain that is not $2^M$. Therefore, the residue signal provided by the amplifier will not accurately reflect the amount of the analog signal after the digitized portion has been removed therefrom. In addition to amplifying and promulgating the errors form preceding stages, each stage will also add a finite gain error to the overall error that will be further amplified by the down-stream amplifiers in the main pipeline as well.

FIG. 2 is a typical op-amp circuit configured and arranged to function as the amplifier 120 depicted in FIG. 1. The gain of the amplifier is given by:

$$V_{out} = \frac{V_{in} * G}{1 + \frac{G}{A}} \Rightarrow V_{out} \approx V_{in} * G\left(1 - \frac{G}{A}\right) \quad (1)$$

Where the nominal gain of the amplifier, G, is equal to (C1+C2)/C2. As illustrated by equation (1) however, the error term G/A reduces the actual gain of the amplifier. If the open-loop gain, A, is not large enough such that this error term is insignificant, then the actual gain of the amplifier stage will be smaller than expected. Consequently, the residue signal will be smaller than anticipated and each subsequent analog to digital conversion of the residue signal will result in an inaccurate output. As noted above, this inaccurate output will be amplified and promulgated by each subsequent ADC stage. Each ADC stage will also add to the overall error due to the finite gain errors inherent in each of the amplifier modules comprising the ADC stages. Therefore, as the residue signal propagates from stage to stage, the error from the upstream ADC stages is amplified and added to by each downstream ADC stage. Because of the size constraints and the processing required when making a pipelined ADC, the open loop gains of the op-amps often have a value of one-thousand (1000) or less and therefore the finite gain errors cannot be ignored.

Therefore it would be advantageous to provide a pipelined ADC that has reduced errors caused by the finite gain of the operational amplifiers used within the amplifier modules of the pipelined ADC.

BRIEF SUMMARY OF THE INVENTION

A pipeline analog to digital converter that includes a main pipeline including a plurality of analog to digital converter stages and a shadow pipeline for compensating the output of the main pipeline. Each of the analog to digital converter stages in the main pipeline provides a digital output and an analog residue signal. The shadow pipeline includes one or more stages that receive at least one gain error signal from one of the analog to digital converter stages in the main pipeline. The shadow pipeline is configured and arranged to processes the gain error signal to form a compensation signal. The compensation signal is combined with the analog residue signal to provide a compensated residue signal in which the finite error gain has been substantially removed. Alternatively, the compensation signal may be converted into a digital format and combined with the digital output bits of one or more of the analog to digital converter stages in the main pipeline to provide a compensated digital output that has had substantially all of the gain error removed therefrom.

In one embodiment, a plurality of analog to digital converter stages in the main pipeline form a plurality of error correcting stages that provide one or more gain error signals to the shadow pipeline. The shadow pipeline processes the received gain error signals and provides a compensation signal. The compensation signal is combined with the analog residue signal to provide an input to a subsequent stage that is substantially free of finite gain error from the preceding amplifier stages.

In another embodiment, the shadow pipeline receives a plurality of gain error signals from a plurality of analog to digital converter stages and accumulates and processes these gain error signals to provide a compensation signal. The compensation signal may be combined with a corresponding analog residue signal to remove the finite gain error terms, or the compensation signal may be converted into a digital form and combined with the digital bits provided as outputs from one or more of the analog to digital converter stages in the main pipeline to remove the finite gain errors contained therein.

BRIEF DESCRIPTION OF THE SEVERAL VIEWS OF THE DRAWING

The invention will be more fully understood by reference to the following Detailed Description of the Invention in conjunction with the drawings of which.

DETAILED DESCRIPTION OF THE INVENTION

Figure 1:
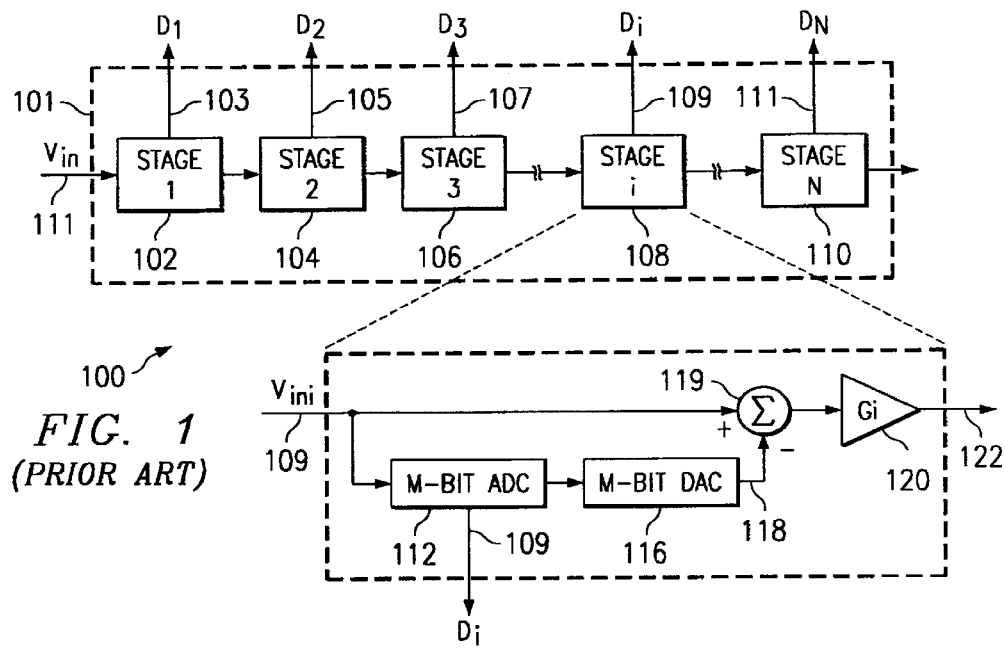
FIG. 1 is a block diagram of a prior art pipeline analog to digital converter.
Figure 2:
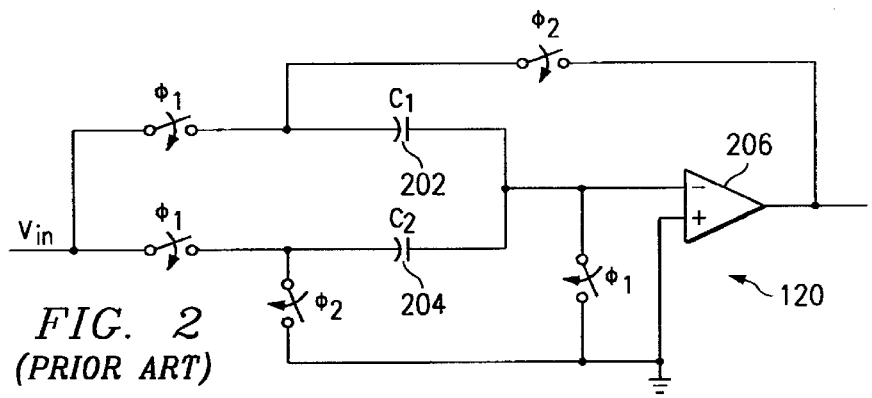
FIG. 2 is a schematic circuit diagram of a prior art switched capacitor amplifier used in the pipeline analog to digital converter depicted in FIG. 1.
Figure 3:
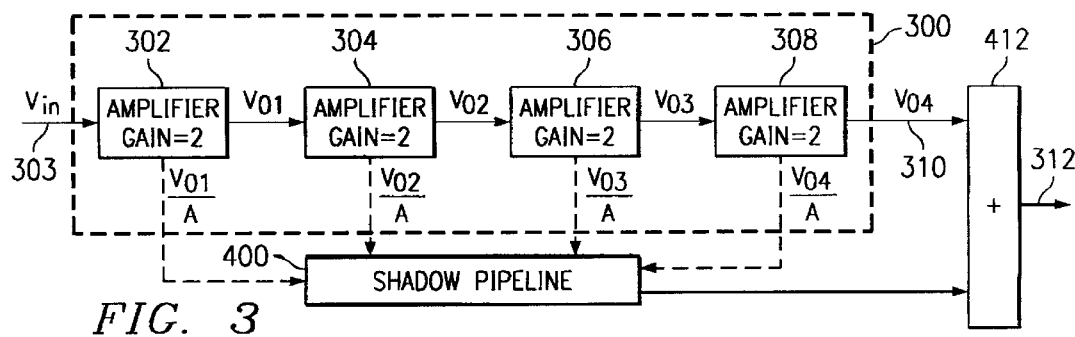
FIG. 3 is a functional block diagram of one embodiment of a pipeline analog to digital converter with an error correcting portion and a shadow pipeline according to the present invention.

FIG. 3 is a block diagram illustrating one embodiment of an apparatus for correcting the finite gain error of one or more amplifiers within an amplifier chain of a pipeline ADC. The apparatus includes an error correcting portion 300 that includes four amplifier gain stages 302, 304, 306, and 308 contained within the amplifier chain within the main amplifier pipeline. At least one of the amplifier stages 302–308 provides a gain error signal, to a shadow pipeline 400. The gain error signals $V_{O1}/A$, $V_{O2}/A$, $V_{O3}/A$, and $V_{O4}/A$ are equal to the output of the particular stage divided by the open-loop gain A, of the operational amplifier used therein. The gain errors are sampled from the input of the summing node of the operational amplifier. The shadow pipeline 400 receives the at least one gain error signal and is configured and arranged to process this signal and to provide as an output an analog compensation signal. The analog compensation signal is combined with the output $V_{O4}$, which is the analog residue signal of stage 308. When combined together, the analog compensation signal will remove substantially all the finite gain error from the $V_{O4}$ signal that will be converted into a digital format by the downstream analog to digital converter stages in the main pipeline.

As noted above, the output of an amplifier stage is given by:

$$V_{Out} \approx V_{In} * G\left(1 - \frac{G}{A}\right) \approx V_{In} * G - V_{In} * \frac{G^2}{A}. \tag{2}$$

Where the term $G(1-G/A)$ is equal to the gain of the amplifier stage. As such, the output signal of the amplifier includes two components. The first component is an ideal output signal $V_{in}*G$ and the second component is an error signal $-V_{in}*G^2/A$. Where G is equal to the nominal gain of the amplifier stage, A, is equal to the open loop gain of the op-amp used internally in the amplifier stage, and $V_{in}$ is equal to the input signal to the amplifier stage. Therefore, each subsequent stage amplifies both the ideal output signal and the error signal of the preceding stage while also providing an additional finite gain error as well. Thus, the output for any amplifier stage within the main pipeline of the analog to digital converter can be approximated as a series expansion in terms of the open loop gain A:

$$V_{Out} = \tag{3}$$
$$V_{in} * \left(G - \frac{G^2}{A}\right)^N = V_{In} * \left(G^N - N * \frac{G^{N+1}}{A}\right) = V_{in} * G^N\left(1 - \frac{N*G}{A}\right)$$

Where all terms having an open-loop gain value of $A^2$ or higher in the denominator are considered negligible so that the series expansion has been truncated after two terms. In equation (3) N is equal to the number amplifier stages within the error correcting portion 300 of the pipelined ADC and G is equal to the gain of each of the amplifiers contained within each stage. Although G is considered constant in equation (3), G may vary from stage to stage. In the event that G varies from stage to stage, the equation (3) can be modified to:

$$V_{Out} = \tag{3A}$$
$$V_{In} * G_1 * G_2 * G_3 * G_4 * \left(1 - \frac{(G_1 + G_2 + G_3 + G_4)}{A}\right).$$

Where the terms $G_1$, $G_2$, $G_3$, and $G_4$ are equal to the amplifier gains for the four amplifier stages within the error correcting portion 300 of the pipeline ADC. Thus, the error due to the finite gain of the op-amps used within the amplifiers contained within the pipeline ADC is given by the second term of either equation (3) or (3A).

In the illustrated embodiments that follow, four (4) stages of a pipelined ADC are used as the error correcting portion

300 of the pipeline ADC. It should be understood that four (4) stages are provided for exemplary purposes only, and that any number of amplifier stages may be included in the error correcting portion of the pipeline ADC architecture. Additionally, only the single error term in equations (3) and (3A) is used in the equations that follow. It should be appreciated that a single error term is used for exemplary purposes only and that any number of error terms in the series expansion shown in equations (3) and (3A) may be used, with increasingly accurate results.

FIGS. 4–7 illustrate embodiments of the present invention that includes a shadow pipeline. The shadow pipeline processes an input error signal provided by one of the amplifier stages in the error correcting portion of the main pipeline amplifier stages. The input error signal is processed by the shadow pipeline to provide a compensation signal 408. The analog compensation signal 408 is combined with the analog residue output signal of the error correcting portion 300 of the main pipeline to compensate for the finite open loop gain of the op-amps used within the amplifier chain of the main pipeline. The processed input gain error signal provided by the shadow pipeline in each figure is arithmetically combined with the signal output provided by the error correcting portion of the main pipeline to provide an output signal 312. In the illustrated embodiments, the processed input error signal is added to the output signal 312 provided by the error correcting portion 300 of the main pipeline since the error term as shown in equations (2), (3), and (3A) is negative. The compensated output signal 312 is provided as an output from the error correcting portion 300 of the main pipeline.

Figure 4:
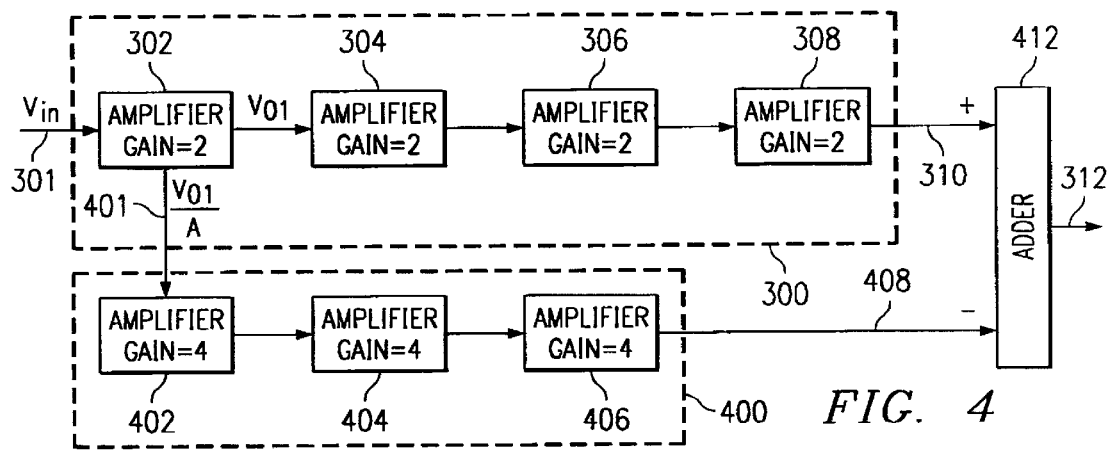
FIG. 4 is a functional block diagram illustrating an embodiment of the functional block diagram depicted in FIG. 3.

In the embodiment depicted in FIG. 4, the first stage 302 in the error correcting portion 300 of the main pipeline provides a gain error signal $V_{O1}/A$ on line 401 to be processed by the shadow pipeline 400. This error signal is multiplied by a gain K that represents the gain of the shadow pipeline 400. To determine the value of the gain K that will substantially remove the finite gain error from the analog residue signal, the error signal is multiplied by K and set equal to the error term in equation (3) or (3A) and solved for the gain K. As noted above, the output on line 310 of the error correcting portion 300 of the main pipeline can be approximated by a truncated series expansion, and assuming each stage in the error correcting portion 300 of the main pipeline has a constant gain G yields:

$$\frac{V_{In} * G * K}{A} = \frac{V_{In} * N * G^{N+1}}{A} \Rightarrow K = G^N * N. \quad (4)$$

Where, N is equal to the number of stages in the error correcting potion 300 of the main pipeline, and G is the constant gain of each amplifier stage in each of the error correcting stages. Therefore, as illustrated in FIG. 4, the value of K, i.e., the gain of the shadow pipeline will be 64, where G=2, and N=4.

In general, for a gain error signal provided by the $j^{th}$ amplifier stage in the error correcting portion 300 having N stages, and in which each stage has a gain of G, the value of the gain K of the shadow pipeline will be:

$$K = G^{N+1-j} * N \quad (5)$$

Figure 5:
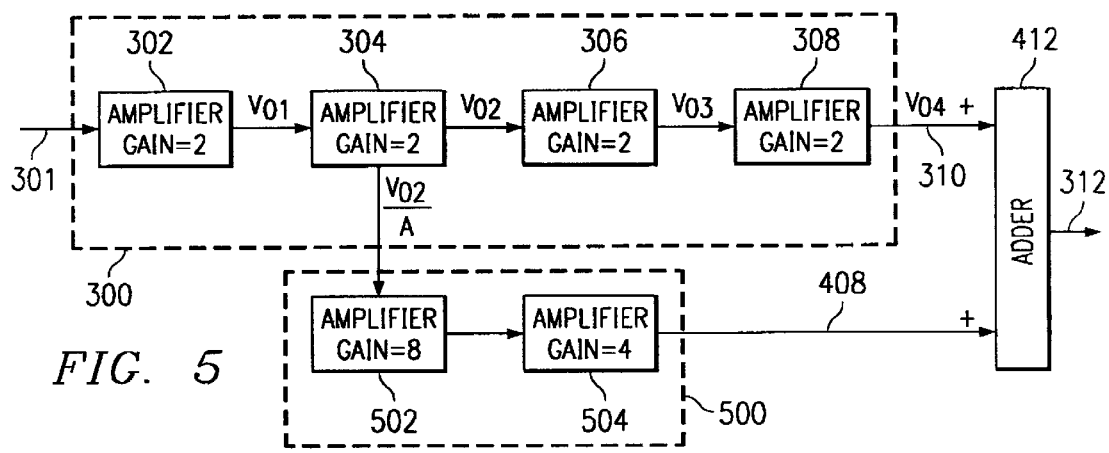
FIG. 5 is a functional block diagram illustrating another embodiment of the functional block diagram depicted in FIG. 3.
Figure 6:
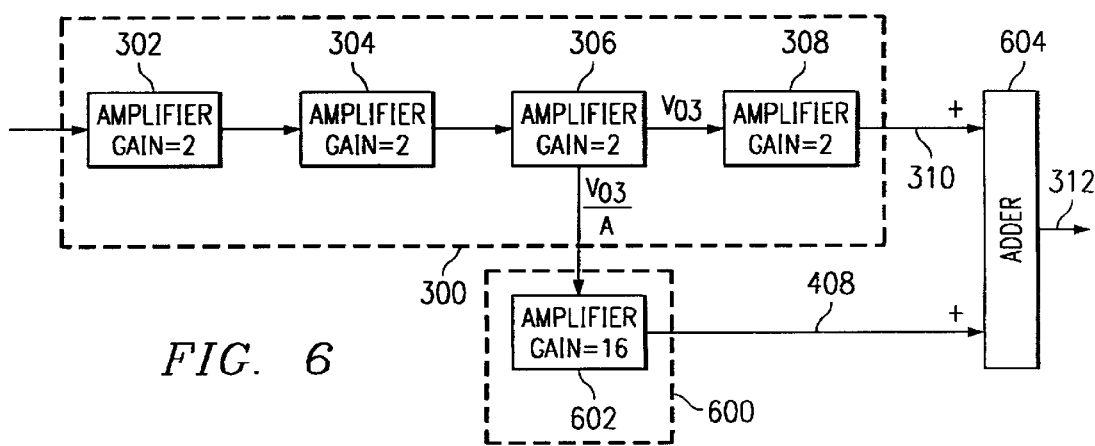
FIG. 6 is a functional block diagram illustrating another embodiment of the functional block diagram depicted in FIG. 3.
Figure 7:
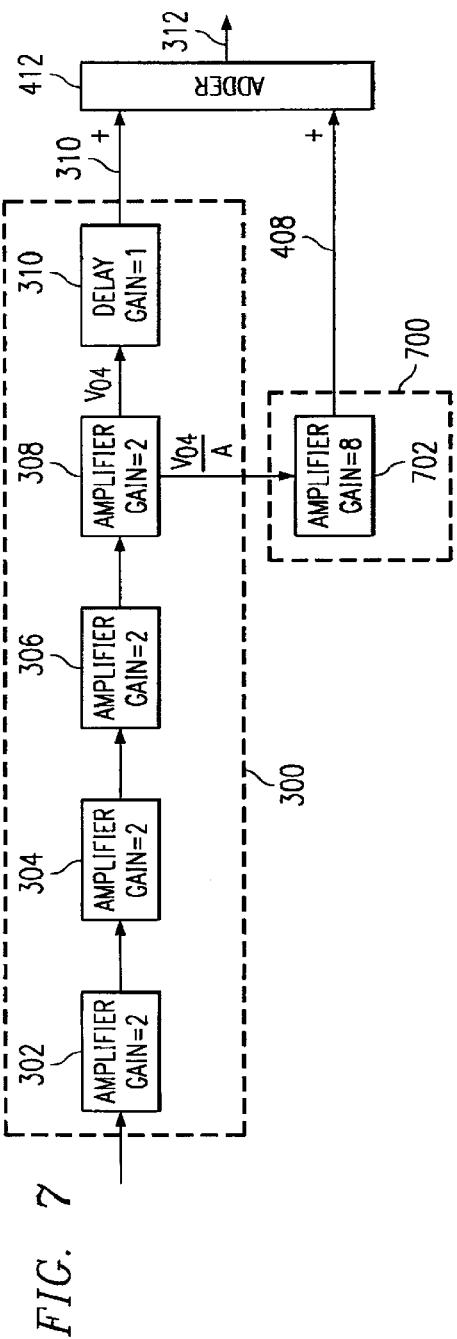
FIG. 7 is a functional block diagram illustrating another embodiment of the functional block diagram depicted in FIG. 3.

Therefore, as illustrated in FIG. 5, for a gain error signal, $V_{O2}/A$, taken from the second stage 306, the total gain K of the shadow pipeline will be $G^{4+1-2}*4=32$. As illustrated in FIG. 6 for a gain error signal, $V_{O3}/A$, taken from the third stage 308, the total gain K of the shadow pipeline will be $G^{4+1-3}*4=16$. As illustrated in FIG. 7, for a gain error signal, $V_{O4}/A$, taken from the fourth stage 310, the total gain K of the shadow pipeline will be $G^{4+1-4}*4=8$. FIG. 7 further includes a delay stage having a gain 1 that may be necessary to ensure that the proper signals are present in the adder 412.

Although only four (4) error correcting stages are used in the illustrative embodiments, any number of error correcting stages may be used. In general, the error contribution by each stage decreases from the most significant bit stage to the least significant bit stage. The selection of the number of error correcting stages to be used within the main pipeline is a function of the accuracy required by the user. Greater accuracy in the final digital output will require more error correcting stages to be used.

In each embodiment depicted in FIGS. 4–7 the shadow pipeline can be any arbitrary number of stages desired by the designer such that the overall gain of the shadow pipeline equals the value K determined in equations (4) or (5). The considerations for the number of amplifier stages in the shadow pipeline may include the area available on the ADC chip available for the amplifier modules, and the size and electrical characteristics of the operational amplifiers and the components used therewith to form the amplifier modules that can be used in the available chip area.

In some circumstances the error correcting stages in the main pipeline of the ADC may have different amplifier gains. For instance, some stages in the pipelined ADC may provide 1 bit of output, some stages may provide 1.5 bits of output, and some stages may provide 2 bits of output. In this case the gain of each stage in the pipelined ADC in equations (4) and (5) then the various gains would be multiplied together to calculate the overall gain of the pipelined amplifier stages as shown below:

$$K = \prod_{n=j+1}^{N} G_n * \left( \sum_{i=1}^{N} G_i \right). \quad (5A)$$

Where the term j is equal to the position of the error correcting stage within the error correcting portion 300 of the main pipeline ADC, and N is equal to the number of stages within the error correcting portion.

Figure 8:
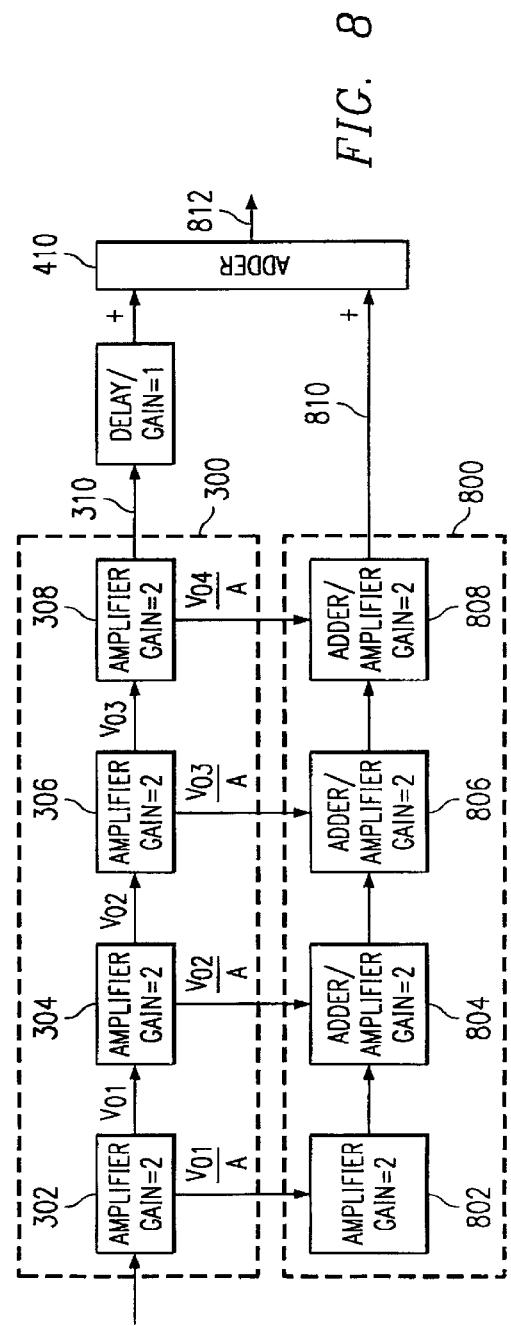
FIG. 8 is a functional block diagram depicting a shadow pipeline including an error-accumulate portion.

FIG. 8 depicts another embodiment of a shadow pipeline 800 in which each stage in the error correcting portion 300 of the main pipeline provides a gain error signal as described above. The shadow pipeline 800 accumulates and combines these errors into an analog compensation signal output on line 810. The compensation signal is combined with the output signal on line 310 from the last stage 308 in the error correcting portion 300 to remove the finite gain errors from the output.

In the embodiment illustrated in FIG. 8 the shadow pipeline 800 includes four (4) error accumulation and processing stages 802, 804, 806, and 808. Each of the error accumulation and processing stages receives a gain error signal from a corresponding stage in the error correcting portion 300 of the main pipeline. Thus, stage 302 provides a gain error signal equal to $V_{O1}/A$ to stage 802. Stage 304 provides a gain error signal equal to $V_{O2}/A$ to stage 804. Stage 306 provides an analog gain error signal equal to $V_{O3}/A$ to stage 806, and stage 308 provides an analog gain error signal equal to $V_{O4}/A$ to stage 808. Each of the error accumulation and processing stages 802–808 add the received gain error signal with a processed signal from a preceding stage, if any, and multiply this sum by a gain factor G to provide an output signal. Thus, if each stage of the pipelined stages has a gain of $G_i$, and each of the stages of the shadow pipeline has a gain of K, then equating the like terms to solve for K in the error yields:

$$\frac{V_{In}}{A} * (G * K^4 + G^2 * K^3 + G^3 * K^2 + G^4 * K) = G^{N+1} * N * \frac{V_{In}}{A} \quad (6)$$

As depicted in FIG. 8, one solution for equation (6) is when G=2 and K=2. In general, the gain K for any shadow pipeline stage is equal to the gain G of the corresponding amplifier stage that provides the gain error signal thereto. However, K may be varied for each stage in the shadow pipelined gain stages so long as the generalized version of equation (6) given below is satisfied:

$$\frac{V_{In}}{A} * \sum_{j=1}^{N}\left(\prod_{k=1}^{j} G_k * \prod_{i=j}^{N} K_i\right) = \frac{V_{In}}{A} * \prod_{i=1}^{N} G_i * \sum_{j=1}^{N} G_j \quad (7)$$

Where the term $K_i$ is equal to the value of the gain of the shadow pipeline stage i, and the term $G_j$ is equal to the gain of each of the pipelined gain stage j.

Figure 9:
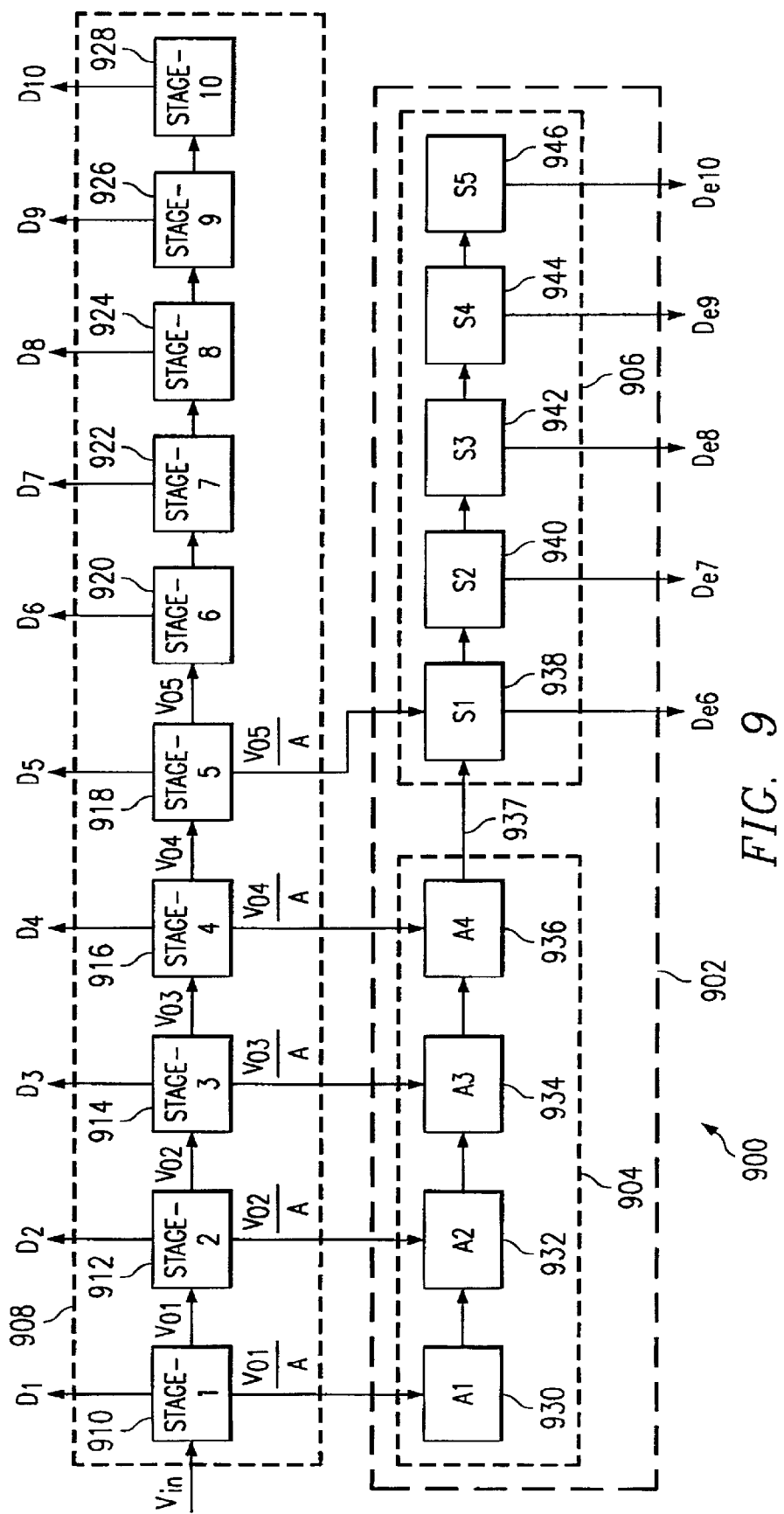
FIG. 9 is a functional block diagram depicting a shadow pipeline including an error-accumulate portion and a analog to digital conversion portion.

FIG. 9 depicts another embodiment of a shadow pipeline 902 that includes one or more error accumulation and processing stages. In this embodiment, the compensation signal provided by the error accumulation and processing stages 904 is converted into a digital format by an analog to digital converter stage 906. The digital compensation signal is then arithmetically combined with the digital output bits from pre-selected stages in the main pipeline, to remove the finite gain errors from the digital output.

In the illustrated embodiment in FIG. 9, the main pipeline 908 includes ten (10) ADC stages, 910–928, forming a 10-bit-pipelined ADC, wherein each stage provides as a digital output one or more digital bits Di, where i is the position of the respective ADC stage. The shadow pipeline 902 is divided into two parts. The first part is an error-accumulate stage 904 that includes four stages 920, 922, 924, and 926 of the shadow pipeline 902. The error-accumulation stage 904 provides as an output an analog compensation signal on line 937. The second part of the shadow pipeline 902 is an analog to digital output stage 906 that receives the analog compensation signal and converts it into a one or more digital error correction bits.

In the illustrated embodiment, the error-accumulate stage 904 receives error signals from the first four stages 910–916 of the main pipeline 908. Only the first four stages are used since the errors produced by these stages provide the largest component of the total error. Each of the four stages 920–926 in the error-accumulate stage 1004 receives a gain error signal, $V_{O1}/A$, $V_{O2}/A$, $V_{O3}/A$, and $V_{O4}/A$ respectively from stages 910–916 respectively in the main pipeline 908.

The first stage 930 in the error-accumulate stage 904 receives the first gain error signal $V_{O1}/A$. The first stage 930 multiplies the received gain error $V_{O1}/A$ by a constant gain factor $K_1$. The gain factor $K_1$ is equal to the gain of the amplifier used in the corresponding ADC stage 910. Each subsequent stage in the error-accumulation stage 904 adds the output of the preceding stage to a gain error signal received from the corresponding amplifier stage in the main pipeline 908. This sum is multiplied by a constant gain factor $K_1$ that is equal to the gain G of the amplifier used in the corresponding ADC stage in the main pipeline 908. Thus, stage 932 receives the output of stage 930 and the gain error signal $V_{O2}/A$. These two signals are added together and the sum is multiplied by a constant gain factor K that is equal to the gain of the amplifier used in the stage 912 in the main pipeline 908. Stage 934 receives the output of stage 932 and the gain error signal $V_{O3}/A$ from stage 914 and processes these signals as described above. The constant gain factor used in multiplying the sum of the two signals is equal to the gain of the stage 914. Stage 936 receives the output of stage 934 and the gain error signal $V_{O4}/A$ from stage 916 and processes these signals as described above. The constant gain factor used in multiplying the sum of the two signals is equal to the gain of the stage 916.

The analog compensation output signal from the last stage 926 in the error accumulation stage 904 is provided to the analog to digital converter stage 906 that includes at least a one bit analog to digital converter. In the illustrated embodiment, the first analog to digital converter stage 928 receives the output from the last stage, 926, of the error accumulate stage 904 and a gain error signal $V_{O5}/A$ from amplifier stage 918 in the main pipeline 908. These signals are added together and converted into a digital format by stages 938, 940, 942, 944, and 946. Each of the analog to digital converter stages 938–946 in the shadow pipeline 902 provide one or more digital error correcting output bits. The digital error correcting output bits from stages 938, 940, 942, 944, and 946 are combined by adding, with the digital output of the corresponding stages 920, 922, 924, 926, and 928 respectively in the main pipeline 908. Similarly, the digital error correcting bits provided by the analog-to-digital converter stages 938–940–942, 944, and 946 could be a 5 bit FLASH analog-to-digital converter, a subranging ADC, a two step or multi-step ADC, a sigma-delta ADC, a cyclic and algorithmic ADC, a single or dual slope ADC, or a successive approximation ADC, or any other form of analog-to-digital converter with suitable output resolution and speed.

Figure 12:
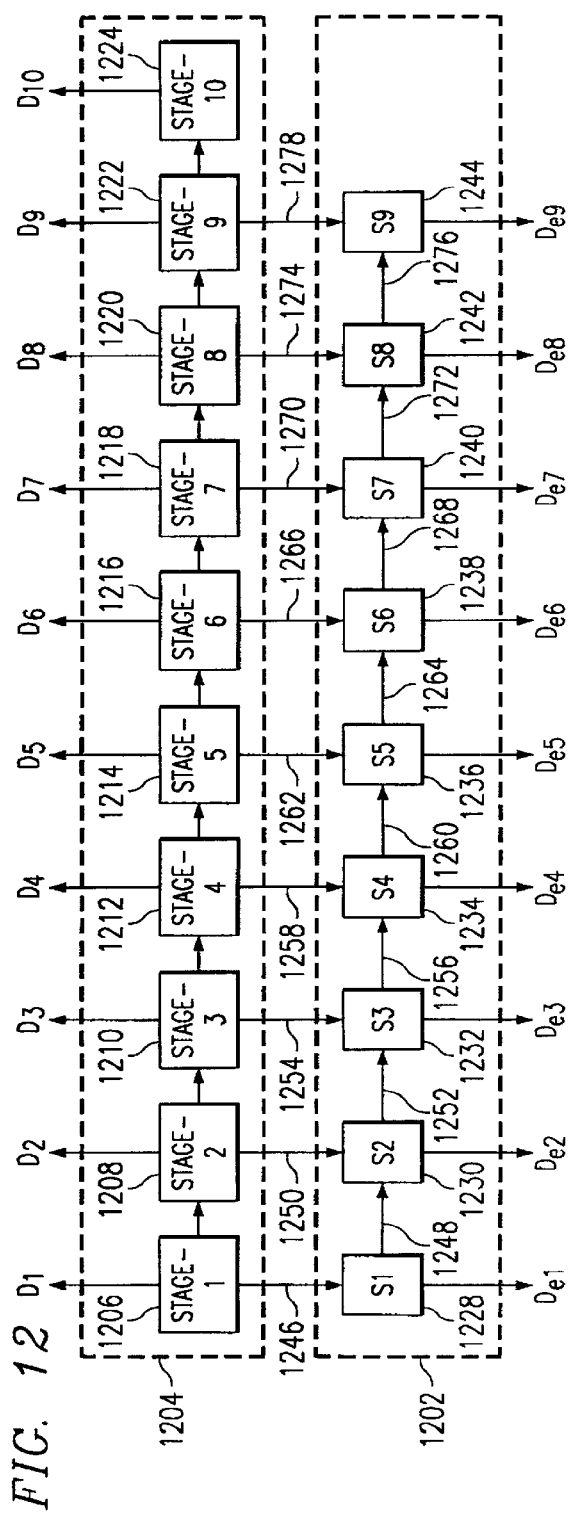
FIG. 12 is a functional block diagram depicting a pipeline analog to digital converter employing an analog to digital conversion shadow pipeline.

FIG. 12 depicts an alternative embodiment in which each stage in the shadow pipeline 1202 is an error-accumulating-analog-to-digital-converter stage. The first stage in the shadow pipeline 1228 receives the output error signal 1246 from the first stage 1206 of the main pipeline 1204. The first shadow stage 1228 converts the output error signal into a M bit digital word and provides a residue signal 1248 to the second stage 1232 of the shadow pipeline 1202. The second stage 1232 receives the residue signal 1248 from the first stage 1230 and an output error signal 1250 from the second stage 1212 of the main pipeline 1208. The second stage 1212 accumulates the two error signals together and converts the accumulated errors into a M-bit digital word, and provides a residue signal 1252 to the third stage 1234 of the shadow pipeline 1202. Each stage subsequent stage 1232–1244 receives the residue signal, 1252–1266 respectively, from the preceding stage and accumulates this residue error signal with the output error signal, 1254–1265 respectively, of the corresponding analog to digital stage in the main pipeline 1204. The output error bits De1–De10 provided by the shadow pipeline 1202 are added to the output bits D1–D10 provided by the main pipeline 1204, respectively, to remove the output gain error term from the digital output. As described above, the output error bits De1–De10 do not have to be provided by a pipelined analog-to-digital converter. The output error bits De1–De10 could be provided by a 10 bit FLASH analog-to-digital converter, a subranging ADC, a two step or multi-step ADC, a sigma-delta ADC, a cyclic and algorithmic ADC, a single or dual slope ADC, or a successive approximation ADC, or any other form of analog-to-digital converter with suitable output resolution and speed.

Figure 10:
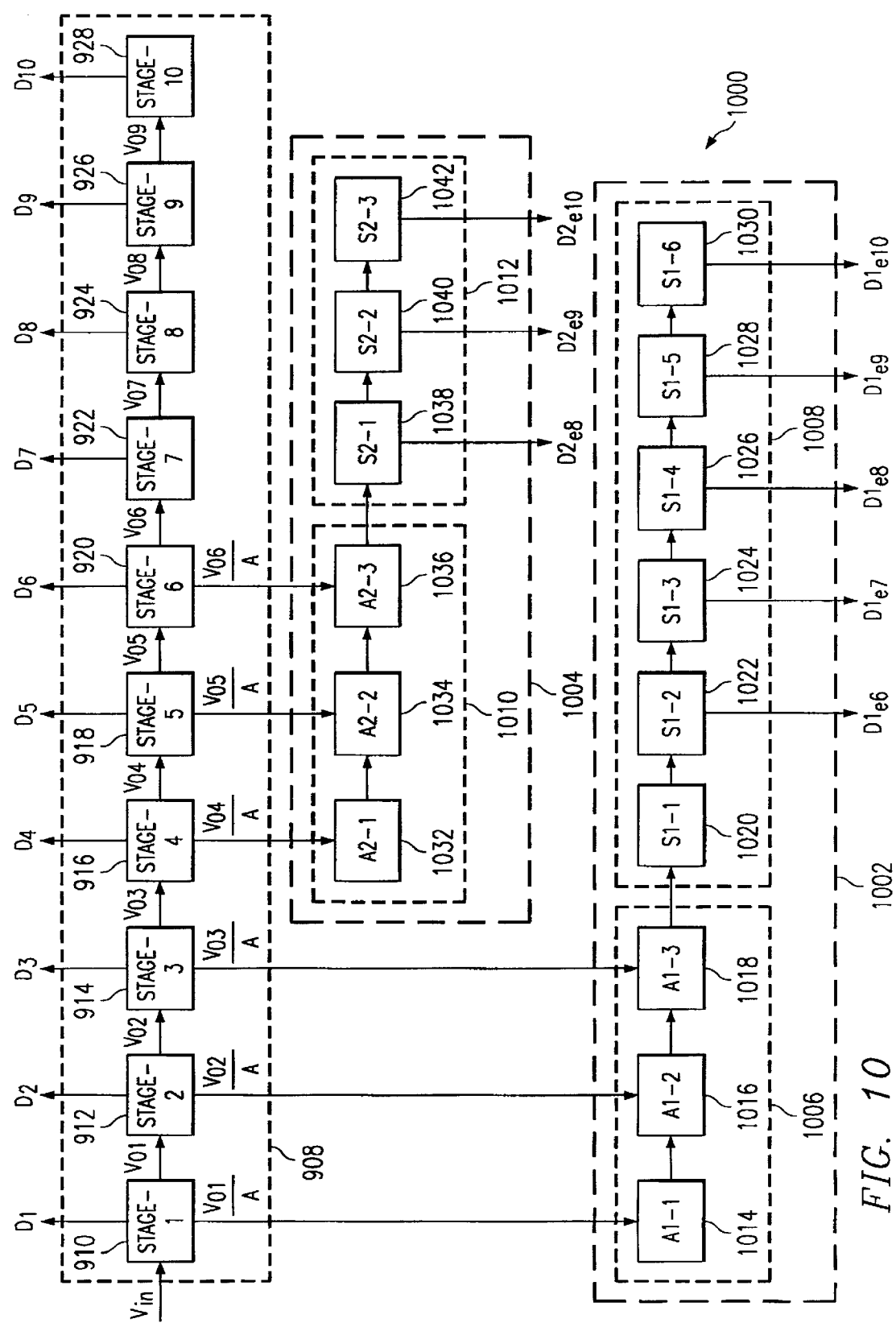
FIG. 10 is a functional block diagram depicting a pipeline analog to digital converter employing two shadow pipelines.

In some circumstances, the gain error signals may be large and an overflow may occur in the error accumulate stage 1004. This may be caused, for example, by op-amps having open loop gains on the order of 50–100 instead of 500–1000. In this case, as depicted in FIG. 10, the shadow pipeline is divided into at least two parts: a first shadow pipeline 1002 and a second shadow pipeline 1004. The first shadow pipeline 1002 includes an error-accumulation stage 1006 that receives a first set of gain error signals $V_{O1}/A$, $V_{O2}/A$, and $V_{O3}/A$ from the first three stages 910–914 of the main pipeline 908. This first set of gain error signals is processed by the error-accumulate stage 1006 as described above with respect to FIG. 9. That is the first stage 1014 in the error-accumulate stage 1006 receives the first gain error signal $V_{O1}/A$. The first stage 1014 multiplies the received gain error $V_{O1}/A$ by a constant gain factor $K_1$. The gain factor K is equal to the gain of the amplifier used in the corresponding ADC stage 910. Each subsequent stage in the error-accumulation stage 1006 adds the output of the preceding stage to a gain error signal received from the corresponding amplifier stage in the main pipeline 908. This sum is multiplied by a constant gain factor K that is equal to the gain G of the amplifier used in the corresponding ADC stage in the main pipeline 908. Thus, stage 1016 receives the output of stage 1014 and the gain error signal $V_{O2}/A$. These two signals are added together and the sum is multiplied by a constant gain factor that is equal to the gain of the amplifier used in the stage 912 in the main pipeline 908. Stage 1018 receives the output of stage 1016 and the gain error signal $V_{O3}/A$ from stage 914 and processes these signals as described above. Stage 1018 provides a first analog compensation signal to a first digital error output stage 1014 where the first analog compensation signal is converted into one or more first digital error correcting bits. The first digital error output stage 1014 can be a pipelined analog-to-digital converter, or a FLASH analog-to-digital converter, a subranging ADC, a two step or multi-step ADC, a sigma-delta ADC, a cyclic and algorithmic ADC, a single or dual slope ADC, or a successive approximation ADC, or any other form of analog-to-digital converter with suitable output resolution and speed.

The second shadow pipeline 1004 includes an error-accumulate stage 1006 that receives a second set of gain error signals $V_{O4}/A$, $V_{O5}/A$, and $V_{O6}/A$ from a second group of error correcting stages 916–920 respectively in the main pipeline 908. This second set of gain error signals is processed by the error-accumulate stage 1006 as described above. That is the second stage 1004 in the error-accumulate stage 1004 receives the first gain error signal $V_{O4}/A$. The first stage 1032 multiplies the received gain error $V_{O4}/A$ by a constant gain factor $K_1$. The gain factor K is equal to the gain of the amplifier used in the corresponding ADC stage 916. Each subsequent stage in the error-accumulation stage 1004 adds the output of the preceding stage to a gain error signal received from the corresponding amplifier stage in the main pipeline 908. This sum is multiplied by a constant gain factor K that is equal to the gain G of the amplifier used in the corresponding ADC stage in the main pipeline 908. Thus, stage 1034 receives the output of stage 1032 and the gain error signal $V_{O5}/A$. These two signals are added together and the sum is multiplied by a constant gain factor that is equal to the gain of the amplifier used in the stage 918 in the main pipeline 908. Stage 1036 receives the output of stage 1034 and the gain error signal $V_{O6}/A$ from stage 920 and processes these signals as described above. Stage 1036 provides a second analog compensation signal to a second digital error output stage 1012 where the second analog compensation signal is converted into one or more second digital error correcting bits. Each of the corresponding digital error correcting bits from the first and second digital error output stages 1012 and 1008 respectively are added to the corresponding digital output bit provided by the main pipeline 1002 in order to substantially remove the finite gain error in the digital output. The second digital error output stage 1012 can be a pipelined analog-to-digital converter, or a FLASH analog-to-digital converter, a subranging ADC, a two step or multi-step ADC, a sigma-delta ADC, a cyclic and algorithmic ADC, a single or dual slope ADC, or a successive approximation ADC, or any other form of analog-to-digital converter with suitable output resolution and speed.

Figure 11:
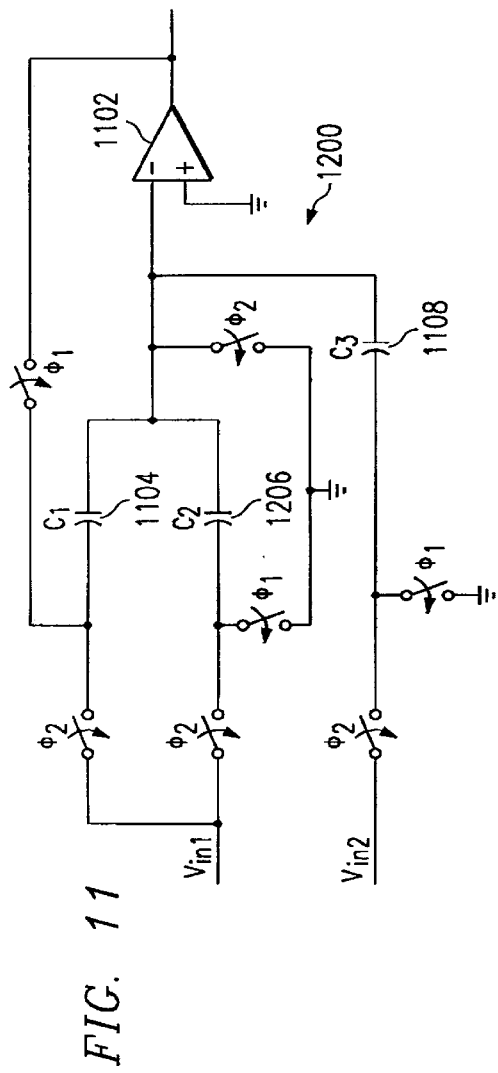
FIG. 11 is a schematic diagram of a switched capacitor circuit suitable for use in the present invention.

FIG. 11 depicts a switched capacitor amplifier that is suitable for use within the shadow pipeline in the embodiments described herein. The output is given by:

$$V_{out} = \frac{V_1 * \left(\frac{C1+C2}{C2}\right)}{1+\left(\frac{C1+C2+C3}{C2*A}\right)} + \frac{V_2 * \frac{C3}{C2}}{1+\left(\frac{C1+C2+C3}{C2*A}\right)} \quad (8)$$

Where C1, C2, and C3 are the values of the capacitors 906, 904, and 908 respectively and A is the open loop gain of the op-amp 902. By eliminating C1 and C3 the above circuit a delay circuit having a gain of one (1) is provided. Eliminating C1 results in an adder circuit having no gain is provided. By adjusting the ratios of the capacitors arbitrary gain factors for the inputs may be provided.

Those of ordinary skill in the art should further appreciate that variations to and modification of the above-described methods and apparatus for correcting the finite gain errors in a pipeline ADC may be made without departing from the inventive concepts disclosed herein. Accordingly, the invention should be viewed as limited solely by the scope and spirit of the appended claims.

What is claimed is:

1. An apparatus for compensating amplifier gain error in a pipelined analog to digital converter having a main pipeline including a plurality of analog to digital converter stages, each stage having a amplifier having a corresponding gain, the apparatus comprising:
   a plurality of error correcting stages including a predetermined number of adjacent analog to digital converter stages in the main pipeline, the plurality of error correcting stages providing a residue output signal;
   a shadow pipeline having at least one shadow stage, the shadow pipeline receiving a gain error signal from at least one of the plurality of error correcting stages, the shadow pipeline configured and arranged to provide a compensation signal;
   the compensation signal being equal to the gain error signal received from the at least one of the plurality of error correcting stages multiplied by a gain factor, wherein the gain factor is substantially equal to the product of the gains corresponding to each of the subsequent error correcting stages, multiplied by the sum of the gains of each gain corresponding to each of the stages in the plurality of error correcting stages; and
   a combination module configured and arranged to combine the compensation signal and the residue output signal to provide an error compensated signal.

2. The apparatus of claim 1 wherein the gain corresponding to the amplifier in each stage in the main pipeline is two and the number of stages in the plurality of error correcting stages in N, and wherein the gain of the at least one shadow gain stage is $N \times 2_N$.

3. The apparatus of claim 2 wherein the first stage of the plurality of error correcting stages is the first analog to digital converter stage in the main pipeline.

4. The apparatus of claim 1 wherein the at least one of the plurality of error correcting stages is the first error correcting stage.

5. The apparatus of claim 1 wherein the combination module is an addition module configured and arranged to add the compensation signal from the residue output signal.

6. The apparatus of claim 1 wherein the at least one shadow stage includes an analog to digital converter, and wherein the compensation signal is at least one digital error bit.

7. An apparatus for compensating amplifier gain error in a pipeline analog to digital converter having a main pipeline including a plurality of analog to digital converter stages, each stage having an amplifier having a corresponding gain, the apparatus comprising:

a plurality of error correcting stages including a predetermined number of adjacent stages in the main pipeline, the plurality of error correcting stages including an initial error correcting stage and a plurality of subsequent error correcting stages, the plurality of error correcting stages providing a residue output signal;

a shadow pipeline including at least one shadow pipeline stage, the at least one shadow stage includes a plurality of shadow stages, wherein a first shadow stage receives a first gain error signal from the first stage in the plurality of error correcting stages, wherein first shadow stage configured and arranged to multiply the first gain error signal by a first gain constant and to provide a first shadow signal, each subsequent shadow pipeline stage receiving a shadow signal from the preceding shadow pipeline stage and a gain error signal from corresponding stage of the plurality of error correcting stages, wherein the shadow pipeline stage adds the shadow signal and the gain error signal together and to multiply the sum by a gain factor, wherein the plurality of shadow stages provide as an output a compensation signal; and a combination module configured and arranged to combine the compensation signal with residue output signal to provide an error compensated signal.

8. The apparatus of claim 7 wherein the gain of each of the plurality of shadow stages is substantially equal to the gain of the corresponding amplifier contained within the analog to digital converter stage in the plurality of error correcting stages that provides the gain error signal thereto.

9. The apparatus of claim 8 wherein the gain corresponding to the amplifier in each stage in the main pipeline is two and the gain of each corresponding stage in the shadow pipeline is two.

10. The apparatus of claim 7 wherein the initial error correcting stage is the first stage of the pipelined analog to digital converter.

11. The apparatus of claim 7 wherein the at least one shadow stage includes an analog to digital converter, and wherein the compensation signal is at least one digital error bit.

12. An apparatus for compensating amplifier gain error in a pipelined analog to digital converter having a main pipeline including a plurality of analog to digital converter stages, each stage providing at least one digital bit and having an amplifier having a corresponding gain, the apparatus comprising:

a shadow pipeline including a plurality of shadow pipeline stages, the shadow pipeline including an error accumulate portion and a shadow analog to digital compensation output portion;

the error accumulate portion receiving a plurality of gain error inputs from a subset of the plurality of analog to digital converter stages contained with in the main pipeline, the error accumulate portion configured and arranged to accumulate and process the received plurality of gain errors and to provide as an output an analog compensation signal the shadow analog to digital output portion of the shadow processor receiving the analog compensation signal, the shadow analog to digital output portion of the shadow processor configured and arranged to provide an M-bit output digital signal representative of the analog compensation error signal wherein M is greater than one; and a digital adder stage configured and arranged to add the M-bit output digital signal with the least significant M bits provided by the plurality of analog to digital converter stages in the main pipeline.

13. The apparatus of claim 12 wherein the shadow analog to digital output portion of the shadow processor includes a pipeline analog to digital converter.

14. The apparatus of claim 12 wherein the shadow analog to digital output portion of the shadow processor includes one from the group of a FLASH analog-to-digital converter, a subranging analog to digital converter, a two step or multi-step analog to digital converter, a sigma-delta analog to digital converter, a cyclic and algorithmic analog to digital converter, a single or dual slope analog to digital converter, or a successive approximation analog to digital converter, or any other form of analog-to-digital converter with suitable output resolution an speed.

15. An apparatus for compensating amplifier gain error in a pipelined analog to digital converter having a main pipeline including a plurality of analog to digital converter stages, each stage providing at least one digital bit and having an amplifier having a corresponding gain, the apparatus comprising:

at least first and second shadow pipelines, each of the first and second shadow pipelines including a plurality of shadow pipeline stages, each of the first and second shadow pipelines including an error accumulate portion and an analog to digital compensation output portion;

the error accumulate portion of the first shadow pipeline receiving a plurality of gain error inputs from a first subset of the plurality of analog to digital converter stages contained within the main pipeline, the error accumulate portion configured and arranged to accumulate and process the received plurality of gain errors and to provide as an output a first analog compensation signal the error accumulate portion of the second shadow pipeline receiving a plurality of gain error inputs from a second subset of the plurality of analog to digital converter stages contained within the main pipeline, the error accumulate portion configured and arranged to accumulate and process the received plurality of gain errors and to provide as an output a second analog compensation signal the error analog to digital output portion of the first shadow processor receiving the first analog compensation signal, the error analog to digital output portion of the shadow processor configured and arranged to provide an M-bit output digital signal representative of the analog compensation error signal;

the error analog to digital output portion of the second shadow processor receiving the second analog compensation signal, the error analog to digital output portion of the shadow processor configured and arranged to provide an L-bit output digital signal representative of the analog compensation error signal;

an adder stage configured and arranged to add the M-bit output digital signal with the least significant M bits provided by the plurality of analog to digital converter stages in the main pipeline and to add the L-bit output digital signal with the least significant L bits provided by the plurality of analog to digital converter stages in the main pipeline.

16. The apparatus in claim 15 wherein the error analog to digital output portion of the first shadow processor includes a pipelined analog to digital converter.

17. The apparatus in claim 15 wherein the error analog to digital output portion of the first shadow processor includes one form the group of a FLASH analog-to-digital converter, a subranging analog to digital converter, a two step of multi-step analog to digital converter, a sigma-delta analog to digital converter, a cyclic and algorithmic analog to digital converter, a single or dual slope analog to digital converter, or a successive approximation analog to digital converter, or any other form of analog-to-digital converter with suitable output resolution and speed.

18. The apparatus claim 15 wherein the error analog to digital output portion of the second shadow processor includes a pipelined analog to digital converter.

19. The apparatus in claim 15 wherein the error analog to digital output portion of the second shadow processor includes one from the group of a FLASH analog-to-digital converter, a subranging analog to digital converter, a two step or multi-step analog to digital converter, a sigma-delta analog to digital converter, a cyclic and algorithmic analog to digital converter, a single or dual slope analog to digital converter, or any other form of analog-to-digital converter with suitable output resolution and speed.

* * * * *